United States Patent
Carletti

(10) Patent No.: US 9,470,738 B2
(45) Date of Patent: Oct. 18, 2016

(54) GROUND FAULT DETECTION

(71) Applicant: Infineon Technologies AG, Neubiberg (DE)

(72) Inventor: Andrea Carletti, München (DE)

(73) Assignee: Infineon Technologies AG, Neubiberg (DE)

( * ) Notice: Subject to any disclaimer, the term of this patent is extended or adjusted under 35 U.S.C. 154(b) by 331 days.

(21) Appl. No.: 14/178,075

(22) Filed: Feb. 11, 2014

(65) Prior Publication Data

US 2015/0226779 A1 Aug. 13, 2015

(51) Int. Cl.
*G01R 31/02* (2006.01)
*G01R 1/20* (2006.01)
*G01R 23/02* (2006.01)

(52) U.S. Cl.
CPC .............. *G01R 31/025* (2013.01); *G01R 1/20* (2013.01); *G01R 23/02* (2013.01)

(58) Field of Classification Search
USPC ....... 324/509, 503, 415, 424, 529, 536, 537, 324/600, 691, 750.3, 76.11, 76.12; 361/42, 361/45, 1, 111, 18, 2, 93.1; 700/293, 58; 702/58
See application file for complete search history.

(56) References Cited

U.S. PATENT DOCUMENTS

| | | | |
|---|---|---|---|
| 4,347,541 A * | 8/1982 | Chen | H02H 3/006 361/105 |
| 6,992,490 B2 * | 1/2006 | Nomoto | B60L 3/0023 324/509 |
| 2003/0067723 A1 * | 4/2003 | Suzui | H02H 3/337 361/42 |
| 2005/0099743 A1 * | 5/2005 | Lee | H02H 3/027 361/42 |

OTHER PUBLICATIONS

P. Nitzewitz et al., "Physics, Principles and Problems" book published by McGraw-Hill, ISBN 0-02-826721-4, 1995.

* cited by examiner

*Primary Examiner* — Melissa Koval
*Assistant Examiner* — Nasima Monsur
(74) *Attorney, Agent, or Firm* — Shumaker & Sieffert, P.A.

(57) ABSTRACT

In one example, a method includes receiving, at an input of a system, an AC signal, rectifying the AC signal into a DC signal, and determining, based on a value of one or more counters in a detection logic, whether or not the input is connected to ground.

21 Claims, 9 Drawing Sheets

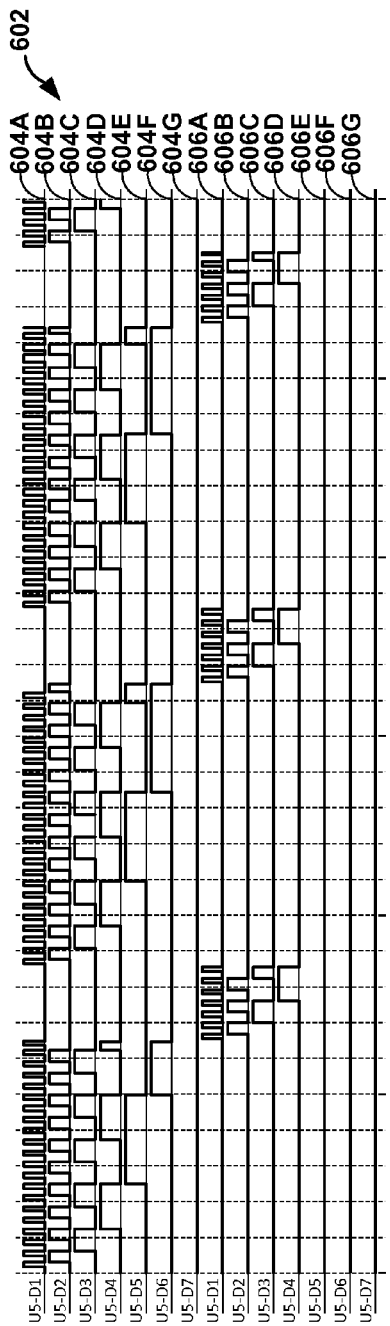
FIG. 6A
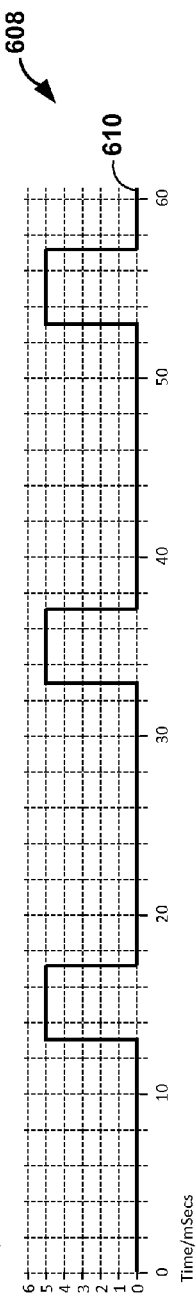
FIG. 6B
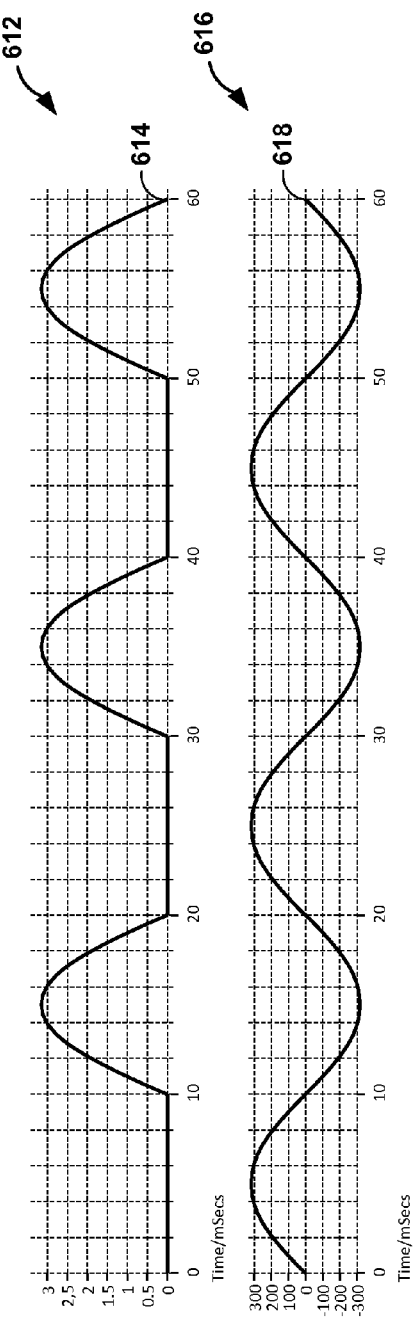
FIG. 6C
FIG. 6D

GROUND FAULT DETECTION

TECHNICAL FIELD

This disclosure relates to electrical grounding, and in particular, to techniques for determining whether or not a device is electrically grounded.

BACKGROUND

A ground connection, sometimes referred to as an earth connection, is an additional path for electrical current to return safely to ground from an electrical device without danger, e.g., in the event of a short circuit. Without a ground connection, an electrical device (such as an electronic device, circuit, electrical box, appliance, power tool, or any device that uses electricity) may become a danger to a person, as the person's body may function as the path to ground in the event of a short circuit. However, in some examples, an electrical device may not automatically detect the absence of a ground connection. Therefore, in some examples, there may be no evidence that an electrical device is lacking a ground connection.

SUMMARY

In general, the techniques described in this disclosure are related to determining whether or not an electrical system is connected to ground. For example, the output of a voltage divider included in a system may be connected to the reset input of a counter such that, if the output does not cross a threshold (and cause the counter to reset) before the counter reaches a value, it may be determined that the system is not connected to ground.

In one example, a method includes receiving, at an input of a system, an AC signal, rectifying the AC signal into a DC signal, and determining, based on a value of one or more counters in a detection logic whether or not the input is connected to ground.

In another example, a system includes an input configured to receive an AC signal, a rectifier configured to rectify the received AC signal into a DC signal, and a ground fault detector configured to determine, based on a value of one or more counters included in the ground fault detector whether or not the input is connected to ground.

In another example, a system includes means for receiving, at an input of a system, an AC signal, means for converting the AC signal into a DC signal, and means for determining whether or not the input is connected to ground. In this example, the means for determining comprises means for counting.

The details of one or more examples of the invention are set forth in the accompanying drawings and the description below. Other features, objects, and advantages of the invention will be apparent from the description and drawings, and from the claims.

BRIEF DESCRIPTION OF DRAWINGS

FIGS. 6A-6D are graphs illustrating various signals of an example circuit for determining whether or not a system is connected to ground, in accordance with one or more techniques of this disclosure.

DETAILED DESCRIPTION

It may be desirable to determine whether or not an electrical system is connected to ground. For instance, to enable ground connectivity determination, an electrical system may include a ground fault detector configured to determine whether or not the electrical system is connected to ground.

In a typical AC powered electrical system, if the system ground connector is connected to ground, the voltage drop between the system ground connector and the system neutral connector may be approximately zero. However, in such a system, if the system ground connector is not connected to ground, the voltage drop between the system ground connector and the system neutral connector may be non-zero.

In accordance with one or more techniques of this disclosure, a ground fault detector may determine whether or not an electrical system is connected to ground by comparing a voltage level of a system ground connector to a voltage level of a system neutral power connector and/or a system phase power connector.

Figure 1A:
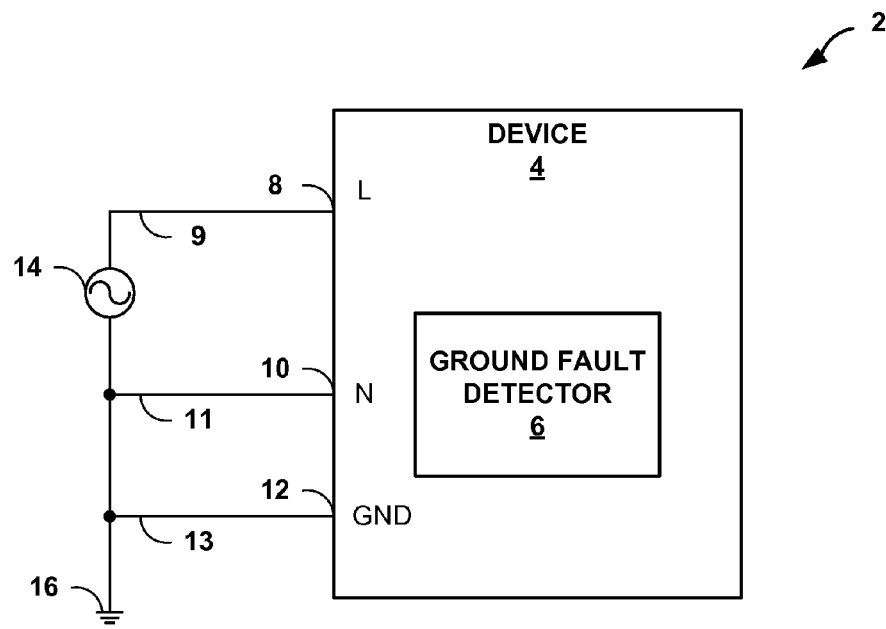
FIGS. 1A-1B are block diagrams illustrating examples of a system with electrical supply lines, in accordance with one or more aspects of the present disclosure.
Figure 1B:
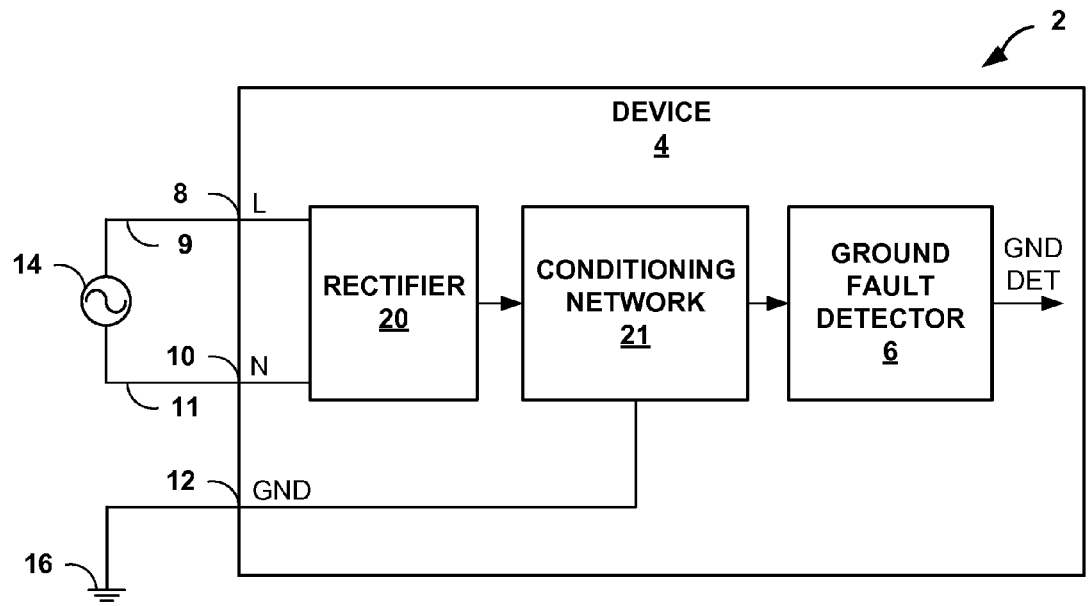

FIGS. 1A-1B are block diagrams illustrating examples of system 2 with electrical supply lines, in accordance with one or more aspects of the present disclosure. As illustrated in FIGS. 1A-1B, electrical system 2 may include device 4, AC source 14, and ground 16.

System 2, in some examples, may include AC source 14. AC source 14 may be configured to provide electrical power in the form of alternating current (AC) to device 4. Examples of AC source 4 include, but are not limited to, a power distribution grid, a power generator, a power inverter, and any other device capable of providing AC power. In some examples, AC source 14 may provide single phase power. In some examples, AC source 14 may provide multi-phase power.

System 2, in some examples, may include device 4. Device 4 may be configured to receive electrical power from AC source 14 and use the received power to perform one or more functions. Some examples of device 4 may include, but are not limited to, electric vehicle supply equipment (EVSE), battery chargers, welding machines, washing machines, clothes drying machines, hair dryers, dishwashing machines, refrigerators/freezers, ovens, power tools, motors, or any other AC powered device. As shown in FIGS. 1A-1B, device 4 may include ground fault detector 6, live AC connector 8, neutral AC connector 10, and ground connector 12. Live AC connector 8 may be connected to the live output of AC source 14 via live AC wire 9, neutral AC connector 10 may be connected to the neutral output of AC source 14 via neutral AC wire 11, and ground connector 12 may be connected to ground 16 via ground wire 13.

In some examples, live AC connector 8, neutral AC connector 10, and ground connector 12 (collectively, the "power connectors") may be connected to their respective wires via a standard mains connector (e.g., a NEMA compliant grounded connector and/or international equivalents). In some examples, such as where device 4 is hardwired, the power connectors may each be separately connected to their respective wires.

In some examples, device 4 may include ground fault detector 6. Ground fault detector 6 may be configured to determine whether or not device 4 is connected to ground. Specifically, ground fault detector 6 may be configured to determine whether or not ground connector 12 is connected to ground 16.

In accordance with one or more techniques of this disclosure, ground fault detector 6 may determine whether or not ground connector 12 is connected to ground 16 by comparing the voltage level at ground connector 12 to the voltage level at neutral AC connector 10. In some examples, ground fault detector 6 may determine that device 4 is ungrounded (i.e., that ground connector 12 is not connected to ground 16) in response to determining that a difference between the voltage level at ground connector 12 and the voltage level at neutral AC connector 10 is greater than a threshold. In some examples, ground fault detector 6 may determine that device 4 is grounded (i.e., that ground connector 12 is connected to ground 16) in response to determining that a difference between the voltage level at ground connector 12 and the voltage level at neutral AC connector 10 is less than a threshold.

As illustrated in the example of FIG. 1B, device 4 may also include rectifier 20 and conditioning network 21. In some examples, rectifier 20 may be configured to convert an AC signal into a DC signal. For instance, rectifier 20 may be configured to convert an AC signal received across live AC connector 8 and neutral AC connector 10 into a DC signal. In some examples, rectifier 20 may be a half-wave rectifier. In some examples, rectifier 20 may be a full-wave rectifier. In some examples, conditioning network 21 may be configured to perform one or more operations to condition the DC signal.

Figure 2A:
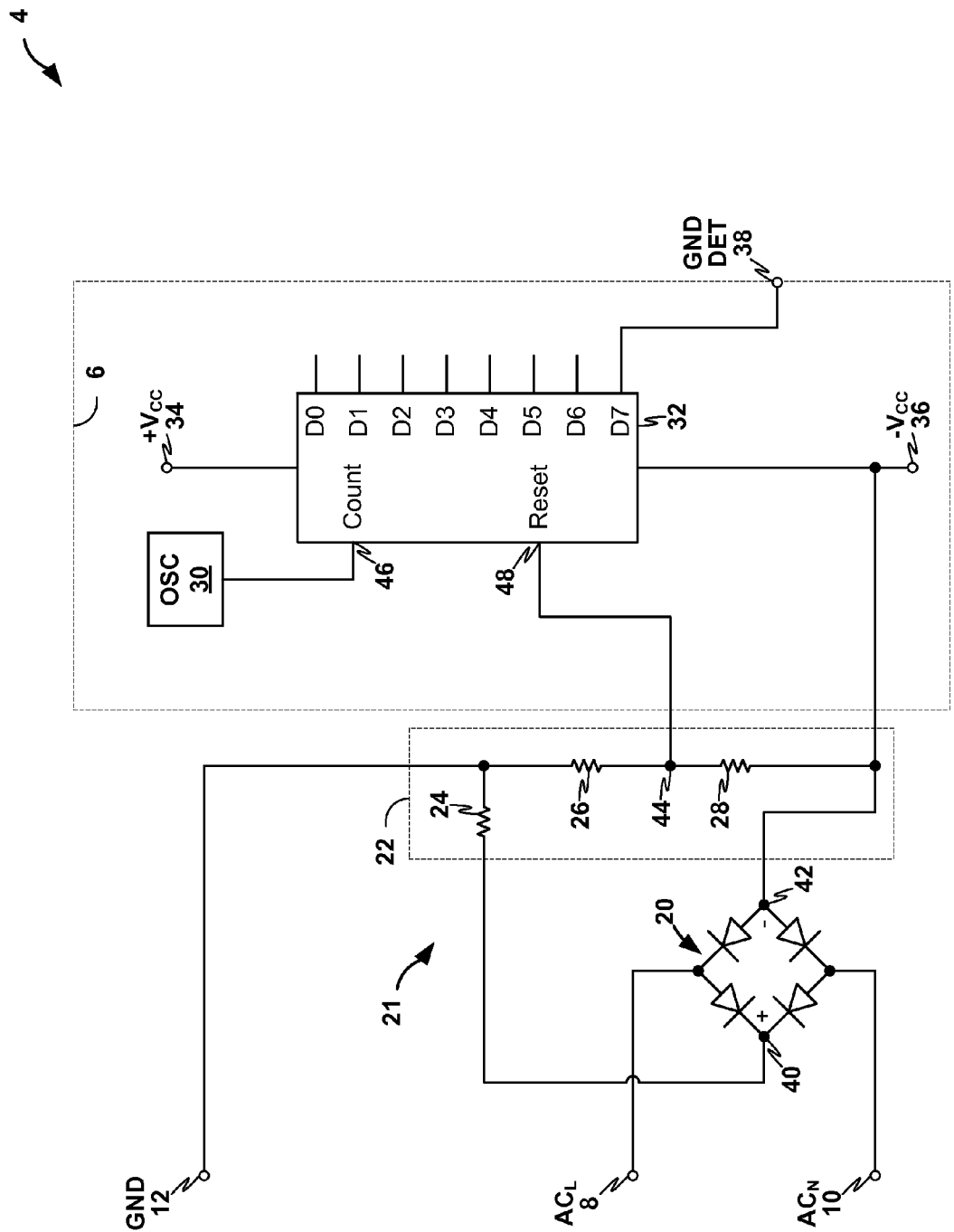
FIGS. 2A-2B are circuit schematics illustrating examples of circuit for determining whether or not a system is connected to ground, in accordance with one or more aspects of the present disclosure.
Figure 2B:
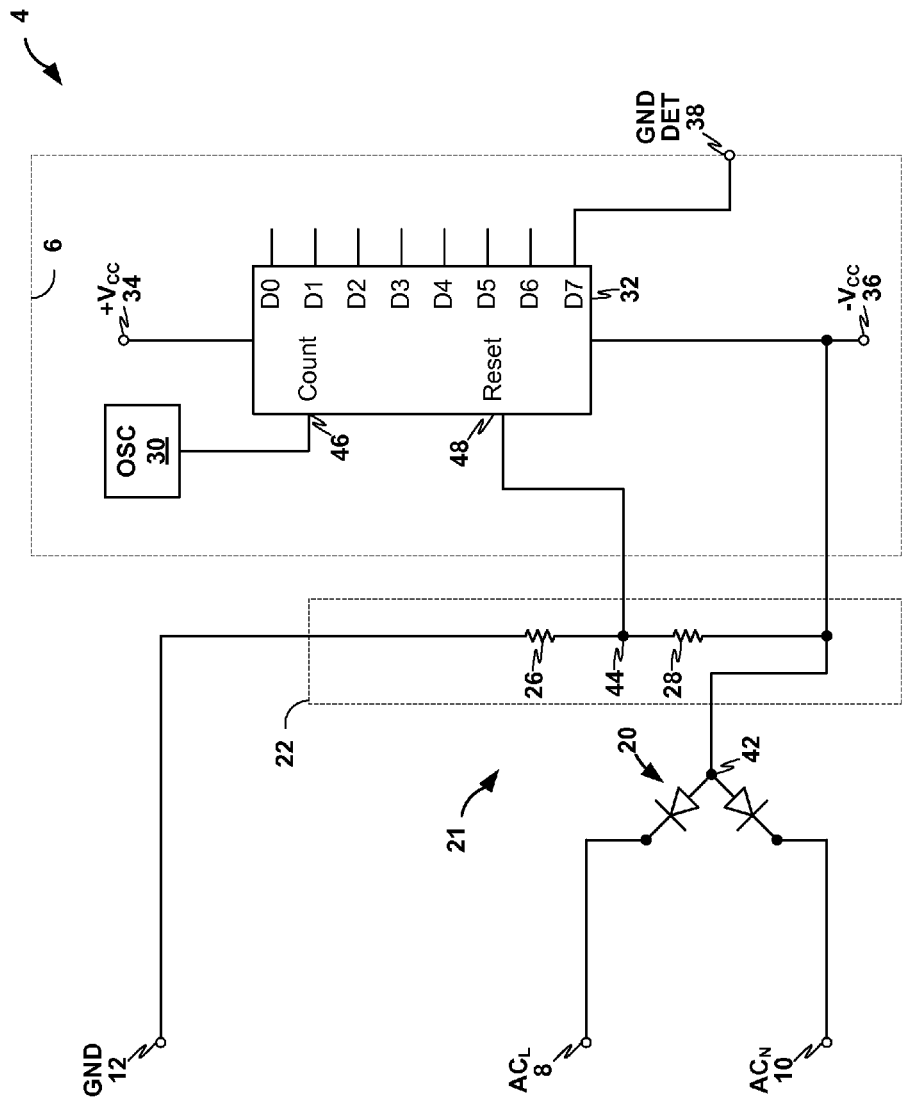

FIGS. 2A-2B are circuit schematics illustrating examples of device 4 including an example circuit for determining whether or not device 4 is connected to ground, in accordance with one or more aspects of the present disclosure. As illustrated in FIGS. 2A-2B, device 4 may include live AC connector 8, neutral AC connector 10, ground connector 12 (collectively, the "power connectors"), ground fault detector 6, rectifier 20, and conditioning network 21.

In some examples, device 4 may include rectifier 20. Rectifier 20 may be configured to convert an AC signal into a DC signal. For instance, rectifier 20 may convert an AC signal received across live AC connector 8 and neutral AC connector 10 into a DC signal output across positive DC node 40 and negative DC node 42. As illustrated in the example of FIG. 2A, rectifier 20 may be a bridge rectifier that includes a plurality of diodes.

In some examples, device 4 may include conditioning network 21 which may be configured to perform one or more operations to condition a signal. In some examples, conditioning network 21 may include voltage divider 22. In some examples, conditioning network 21 may include voltage divider 22 and one or more additional components.

Voltage divider 22 may be configured scale a voltage signal based on a ratio between a first impedance level and a second impedance level. As illustrated in FIG. 2A, voltage divider 22 may include first resistor 24 electrically positioned between positive DC node 40 and ground connector 12, second resistor 26 electrically positioned between ground connector 12 and node 44, and third resistor 28 electrically positioned between node 44 and negative DC node 42. In some examples, voltage divider 22 may scale the voltage signal in accordance with equation (1), below, where $V_{out}$ is the voltage signal output at node 44, $V_{in}$ is the voltage signal at positive DC node 40, $Z_2$ is the impedance between node 44 and negative DC node 42, and $Z_1$ is the impedance between node 44 and positive DC node 40.

$$V_{out} = \frac{Z_2}{Z_1 + Z_2} V_{in} \quad (1)$$

In some examples, voltage divider 22 may be configured to have a ratio selected such that, during the time period corresponding to the negative half-wave of the AC signal, the output of voltage divider 22 exceeds a threshold if the input is connected to ground. For instance, the ratio may selected such that, during a time period corresponding to the negative half-wave of the AC signal, the voltage at node 44 is logic high if ground connector 12 is connected to ground. As one example, if the AC signal has an RMS voltage of 230 volts and the logic high threshold is 2.5 volts, resistor 24 and resistor 26 may have an impedance of 1 MΩ, and resistor 28 may have an impedance of 10 kΩ.

In some examples, device 4 may include ground fault detector 6. Ground fault detector 6 may be configured to determine whether or not device 4 is connected to ground. Specifically, ground fault detector 6 may be configured to determine whether or not ground connector 12 is connected to ground 16. As illustrated in FIG. 2A, ground fault detector 6 may include oscillator 30, and counter 32.

In some examples, ground fault detector 6 may include counter 32. Counter 32 may be configured to increment an output value (i.e., count) in response to receiving a signal at count input 46. In some examples, counter 32 may increment the output value by adjusting the logic levels of outputs D0-D6. For instance, initially, the output value may be 0 (i.e., the signals at outputs D0-D6 may be logic low), then, in response to receiving a logic high signal at count input 46, counter 32 may increment the output value to 1 (i.e., the signal at output D0 may be logic high and the signals at outputs D1-D6 may be logic low). Similarly, if a logic high signal is received by counter 32 when the output value is 127 (i.e., the signals at outputs D0-D5 may be logic high and the signal at output D6 may be logic low), counter 32 may increment the output value to 128 (i.e., the signals at outputs D0-D5 may be logic low and the signal at output D6 may be logic high). Counter 32 may also be configured to reset the output value in response to receiving a signal at reset input 48. For instance, if a logic high signal is received at reset input 48 when the output value is 127, counter 32 may reset the output value to 0. In some examples, if the voltage level of a signal is greater than one-half of the difference between the voltage level at $+V_{cc}$ 34 and $-V_{cc}$ 36, counter 32 may determine that the signal is logic high. In some examples, if the voltage level of a signal is less than one-half of the difference between the voltage level at $+V_{cc}$ 34 and $-V_{cc}$ 36, counter 32 may determine that the signal is logic low.

In some examples, ground fault detector 6 may include oscillator 30. Oscillator 30 may be configured to output a clock signal at a frequency. In some examples, the frequency of the clock signal output by oscillator 30 may be based on the frequency of the AC signal received across live AC connector 8 and neutral AC connector 10, and a bit depth of counter 32. In some examples, the frequency of the clock signal output by oscillator 30 may be determined in accordance with equation (2), below, where n is a number of bits less than or equal to the bit depth of the output value of counter 32, $f_{AC}$ is the frequency of the AC signal received across live AC connector 8 and neutral AC connector 10, and $f_{clock}$ is the frequency of the clock signal output by oscillator 30.

$$f_{clock} = \frac{2^n}{2} f_{AC} \qquad (2)$$

For example, if the frequency of the AC signal received across live AC connector 8 and neutral AC connector 10 is 50 Hz and the bit depth of the output of counter 30 is less than or equal to 8 bits (i.e., 256 steps), the frequency of the clock signal output by oscillator 30 may be 6400 Hz.

In operation, device 4 may receive an AC signal across live AC connector 8 and neutral AC connector 10. In some examples, the AC signal may be a mains voltage signal (e.g., ~120 volts RMS @ 60 Hz in the United States, and 230 volts RMS @ 50 Hz in Germany).

Rectifier 20 may convert the received AC signal into a DC signal. In some examples, rectifier 20 may convert the received AC signal into a DC signal by allowing current to flow from live AC connector 8 to positive DC node 40 during the positive half-wave of the AC signal and by allowing current to flow from live AC connector 8 to negative DC node 42 during the negative half-wave of the AC signal. Similarly, rectifier 20 may allow current to flow from negative DC node 42 to neutral AC connector 10 during the positive half-wave of the AC signal and by allowing current to flow from positive DC node 40 to neutral AC connector 10 during the negative half-wave of the AC signal.

During the negative half-wave of the AC signal, the voltage level at node 44 may depend on whether or not ground connector 12 is connected to ground. For instance, if ground connector 12 is connected to ground, the voltage across resistor 24 will be approximately zero because the voltage at neutral AC connector 10 should be approximately equal to the voltage at ground connector 12. As a result, during the negative half-wave of the AC signal, the output of voltage divider 22 may be determined approximately in accordance with equation (1 a), below, where $V_{44}$ is the voltage at node 44, $Z_{28}$ is the impedance of resistor 28, $Z_{26}$ is the impedance of resistor 26, $V_{40}$ is the voltage at positive DC node 40, and $V_{42}$ is the voltage at negative DC node 42.

$$V_{44} = \frac{Z_{28}}{Z_{26} + Z_{28}}(V_{40} - V_{42}) \qquad (1a)$$

For example, if resistor 24 and resistor 26 each have an impedance of 1 MΩ, resistor 28 has an impedance of 10 kΩ, and the voltage across positive DC node 40 and negative DC node 42 is 252.5 volts, the voltage at node 44 may be 2.5 volts. Therefore, if the voltage across live AC connector 8 and neutral AC connector 10 AC signal has a frequency of 50 Hz and an RMS voltage of 230 volts (i.e., a peak voltage of ~325 volts), the voltage at node 44 will exceed 2.5 volts within 20 ms if ground connector 12 is connected to ground. In other words, if ground connector 12 is connected to ground, the voltage at node 44 will exceed a threshold value within a threshold period of time.

However, if ground connector 12 is not connected to ground, the voltage across resistor 24 may be non-zero. As a result, the output of voltage divider 22 may be different when ground connector 12 is not connected to ground then when ground connector 12 is connected to ground. If the voltage drop across resistor 24 (i.e., the potential difference between ground connector 12 and neutral AC connector 10) becomes large enough, the voltage at node 44 may not reach the threshold value within a threshold period of time.

Oscillator 30 may output a clock signal that causes counter 32 to count (i.e., to increment the output value of counter 32). As discussed above, the frequency at which oscillator 30 may cause counter 32 to count may be based on the frequency of the AC signal and a bit depth of counter 32. In the example of FIG. 2A, counter 32 may have a bit depth of 8 (i.e., counter 32 may be capable of counting from 0 to 255) and the AC signal may have a frequency of 50 Hz. Therefore, in the example of FIG. 2A, in accordance with equation (2), oscillator 30 may cause counter 32 to increment its output value at a rate of 6400 Hz, or every 156.25 μs. At such a frequency, when starting from zero, the output value of counter 32 will reach 128 after 20 ms of counting. Additionally, as discussed above, in response to receiving a logic high signal at reset 48, counter 32 may reset its output value to zero.

In accordance with one or more techniques of this disclosure, ground fault detector 6 may determine whether or not ground connector 12 is connected to ground based on the output value of counter 32. For example, ground fault detector 6 may determine that ground connector 12 is connected to ground in response to determining that counter 32 has not reached a value. As another example, ground fault detector 6 may determine that ground connector 12 is not connected to ground in response to determining that counter 32 has reached a threshold value.

In the example of FIG. 2A, the threshold value may be 128. As discussed above, counter 32 may determine that a signal greater than one-half of the difference between $+V_{CC}$ 34 and $-V_{CC}$ 36 is a logic high signal. As such, if the difference between $+V_{CC}$ 34 and $-V_{CC}$ 36 is 5 volts, counter 32 may reset its output value to zero in response to the voltage at node 44 becoming greater than 2.5 volts. Therefore, if resistor 24 and resistor 26 each have an impedance of 1 MΩ, resistor 28 has an impedance of 10 kΩ, and the voltage across live AC connector 8 and neutral AC connector 10 (i.e., the AC signal) has a frequency of 50 Hz and an RMS voltage of 230 volts, the voltage at node 44 will reach at least 2.5 volts, and thereby cause counter 32 to reset its output value, prior to the output value of counter 32 reaching 128 if ground connector 12 is connected to ground. However, if ground connector 12 is not connected to ground, the output value of counter 32 may reach 128 prior to the voltage at node 44 reaches 2.5 volts. In some examples, the voltage at node 44 may never reach 2.5 volts when ground connecter 12 is not connected to ground. In this way, ground fault detector 6 may determine whether or not device 4 is grounded.

In some examples, ground fault detector 6 may output a signal that indicates whether or not device 4 is grounded. In some examples, ground fault detector 6 may output the signal at ground detected output 38. In some examples, such as in the example of FIG. 2A, the pin representing the eighth bit of counter 32 (i.e., "D7") may be connected to ground detected output 38.

In some examples, in response to receiving a signal at ground detected connector 38 that indicates that device 4 is not grounded, device 4 may not perform one or more functions. For example, if device 4 includes EVSE configured to charge an electric vehicle, in response to determining that device 4 is not grounded, device 4 may prevent the EVSE from supplying power to the electric vehicle. In this way, device 4 may mitigate the risk of electric shock due to a disconnected ground connection.

As illustrated in the example of FIG. 2B, in some examples device 4 may not include some of the components illustrated in FIG. 2A and/or may include components different than those illustrated in FIG. 2A. For example, as illustrated in the example of FIG. 2B, rectifier 20 of device 4 may be a half-wave rectifier. In such examples, device 4 may not include resistor 24. In this way, device 4 may determine whether or not device 4 is connected to ground with fewer parts than illustrated in FIG. 2A. Also in this way, device 4 may determine whether or not device 4 is connected to ground with a reduced power consumption than the example illustrated in FIG. 2A.

Figure 3:
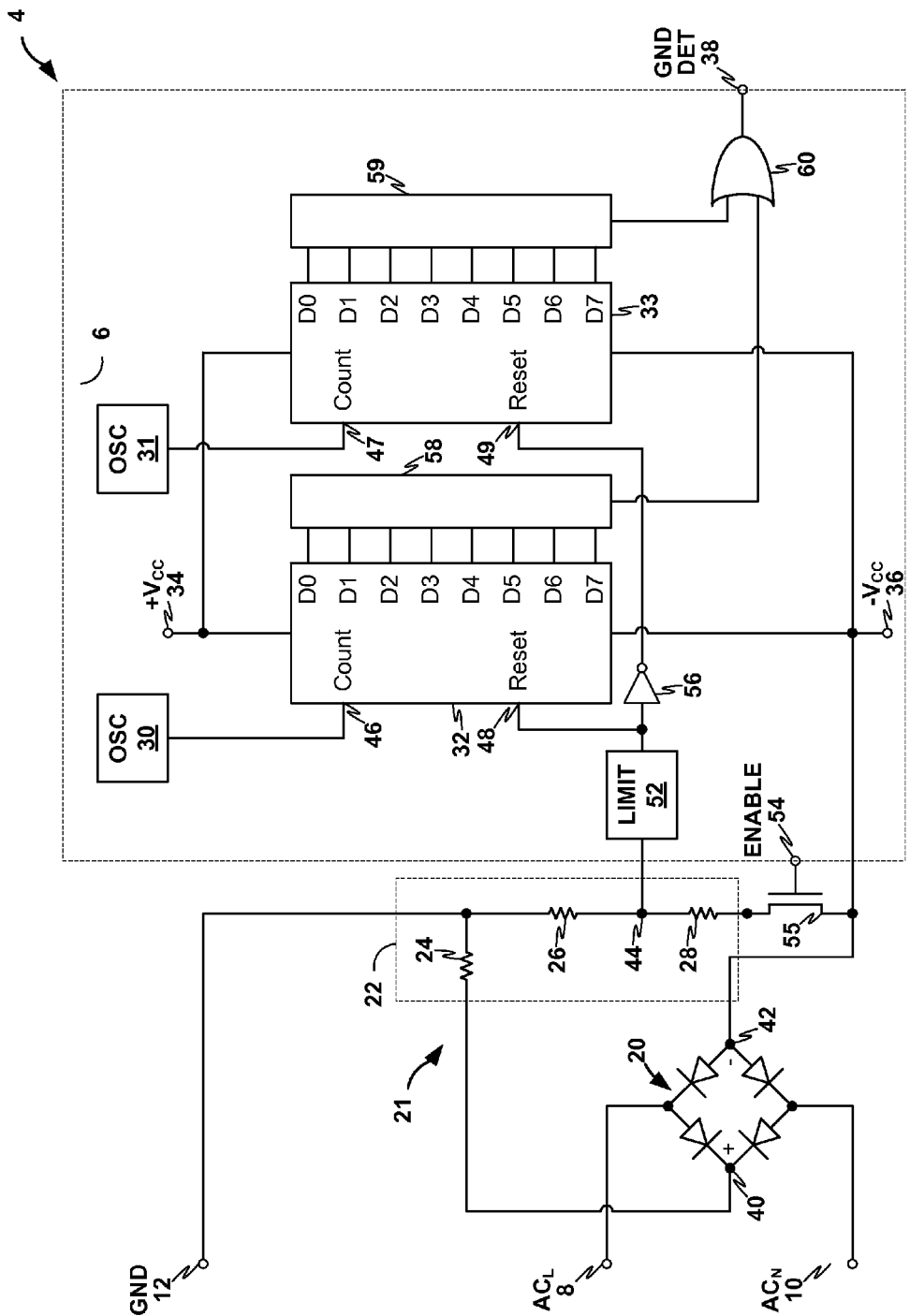
FIG. 3 is a circuit schematic illustrating an example device that includes an example circuit for determining whether or not a system is connected to ground, in accordance with one or more aspects of the present disclosure.

FIG. 3 is a circuit schematic illustrating device 4 including an another example circuit for determining whether or not device 4 is connected to ground, in accordance with one or more aspects of the present disclosure. As illustrated in FIG. 3, device 4 may include live AC connector 8, neutral AC connector 10, ground connector 12 (collectively, the "power connectors"), ground fault detector 6, rectifier 20, conditioning network 21, and switch 55. The features of live AC connector 8, neutral AC connector 10, ground connector 12, rectifier 20, and voltage divider 22 are described above with reference to FIG. 2A.

In some examples, device 4 may include conditioning network 21 which may be configured to perform one or more operations to condition a signal. As illustrated in FIG. 3, conditioning network 21 may include voltage divider 22. The features of voltage divider 22 are described above with reference to FIG. 2A.

In some examples, device 4 may include ground fault detector 6 which may be configured to determine whether or not device 4 is connected to ground. As illustrated in FIG. 3, ground fault detector 6 may include oscillator 30, oscillator 31, counter 32, counter 33, comparator 58, comparator 59, limiter 52, inverter 56, and logic gate 60. The features of oscillator 30, and counter 32 are described above with reference to FIG. 2A.

In some examples, ground fault detector 6 may include counter 33. Counter 33 may be configured similarly to counter 32. For example, counter 33 may be configured to increment an output value (i.e., count) in response to receiving a signal at count input 47. As another example, counter 33 may also be configured to reset the output value in response to receiving a signal at reset input 49.

In some examples, ground fault detector 6 may include comparator 58 and/or comparator 59 (collectively, the "comparators"). The comparators may be configured to receive a plurality of inputs and determine an output. For instance, comparator 58 may be configured to output a signal indicating whether or not the output value of counter 32 has or has not reached a threshold value. Similarly, comparator 59 may be configured to output a signal indicating whether or not the output value of counter 33 has or has not reached a threshold value. In some examples, the threshold values used by the comparators may be based on the frequency of the AC signal received across live AC connector 8 and neutral AC connector 10.

In some examples, ground fault detector 6 may include limiter 52. Limiter 52 may be configured to limit a voltage signal to within a threshold. In some examples, limiter 52 may be configured to receive a voltage signal from node 44, limit the voltage signal such that it is within a threshold, and provide the thresholded voltage signal to counter 32 and inverter 56. In this way, limiter 52 may protect one or more components from overvoltage (e.g., counter 32, counter 33, and inverter 56).

In some examples, ground fault detector 6 may include inverter 56. Inverter 56 may be configured to invert a voltage signal and/or a logic signal. For example, in response to receiving a logic high signal (e.g., a signal greater than one-half of the difference between $+V_{cc}$ 34 and $-V_{cc}$ 36) from node 44 via limiter 52, inverter 56 may provide a logic low signal (e.g., a signal less than one-half of the difference between $+V_{cc}$ 34 and $-V_{cc}$ 36) to counter 33. As another example, in response to receiving a logic low signal from node 44 via limiter 52, inverter 56 may provide a logic high signal to counter 33. In some examples, such as the example of FIG. 3, the presence of inverter 56 may cause counter 33 to receive a reset signal when counter 32 is not receiving a reset signal, and may cause counter 33 to not receive a reset signal when counter 32 is receiving a reset signal.

In some examples, ground fault detector 6 may include logic gate 60. Logic gate 60 may be configured to output a signal based on the logical state of two or more input signals. In some examples, logic gate 60 may be an OR gate configured to output a logic high signal if any of the input signals are logic high. In some examples, a first input of logic gate 60 may be the output of comparator 58 and a second input of logic gate 60 may be the output of comparator 59.

In some examples, device 4 may include switch 55. Switch 55 may be configured to conduct or not conduct based on an input signal. For example, switch 55 may conduct in response to receiving a signal at enable 54 that is greater than a threshold. As another example, switch 55 may not conduct in response to receiving a signal at enable 54 that is less than a threshold. Examples of switch 55 may include transistors, relay switches, and the like.

As discussed above with reference to FIG. 2A, in operation, device 4 may receive an AC signal across live AC connector 8 and neutral AC connector 10, rectifier 20 may convert the received AC signal into a DC signal, and oscillator 30 may output a clock signal that causes counter 32 and/or counter 33 to count. In some examples, as illustrated in FIG. 3, device 4 may include a second oscillator 31 which may output a clock signal that causes counter 33 to count. In some examples oscillator 31 may output a clock signal similar to the clock signal output by oscillator 30 (e.g., similar frequency, similar duty cycle, etc. . . . ). In some examples oscillator 31 may output a clock signal different than the clock signal output by oscillator 30 (e.g., different frequency, different duty cycle, etc. . . . ).

Additionally, as discussed above with reference to FIG. 2A, ground fault detector 6 may determine whether or not ground connector 12 is connected to ground based on the output value of counter 32. For instance, ground fault detector 6 may determine that ground connector 12 is not connected to ground if the output value of counter 32 reaches a threshold value prior to counter 32 receiving a reset signal (i.e., a logic high signal at reset input 48). In accordance with one or more techniques of this disclosure, ground fault detector 6 may additionally or alternatively determine whether or not ground connector 12 is connected to ground based on the output value of counter 33. For example, ground fault detector 6 may determine that ground connector 12 is not connected to ground if the output value of counter 33 does not reach a threshold value prior to counter 33 receiving a reset signal (i.e., a logic high signal at reset input 49). In other words, ground fault detector 6 may determine that ground connector 12 is not connected to ground if the voltage level at node 44 does not remain at the logic high level for a long enough period of time.

In some examples, device 4 may be connected to ground if a ground wire is connected to both ground (e.g., a grounding pin) and ground connector 12 of device 4. In some examples, if the output value of counter 32 reaches a first threshold value, ground fault detector 6 may determine that device 4 is not connected to ground within a first distance of device 4. Device 4 may be connected to ground within the first distance if a ground wire is connected to ground connector 12 and the ground wire is either longer than the first distance, or the ground wire is actually connected to ground. For instance, if the output value of counter 32 reaches the first threshold value, ground fault detector 6 may determine that device 4 is not connected to ground within 100 or more meters from device 4. Some example scenarios that may detected by counter 32 are where ground connector 12 is not connected to anything, and/or where ground connector 12 is connected to a ground wire, but the ground wire itself is not connected to ground and is shorter than the first distance (e.g., the result of an improper installation or a break in the ground wire).

In some examples, if the output value of counter 33 does not reach a second threshold value, ground fault detector 6 may determine that device 4 is not connected to ground within a second distance of device 4. Device 4 may be connected to ground within the second distance if a ground wire is connected to ground connector 12 and the ground wire is either longer than the second distance, or the ground wire is actually connected to ground. For instance, if the output value of counter 33 does not reach the second threshold value, ground fault detector 6 may determine that device 4 is not connected to ground within, for instance, 200 meters of device 4. Some example scenarios that may detected by counter 32 are where ground connector 12 is connected to a ground wire, but the ground wire itself is not connected to ground and is shorter than the second distance (e.g., the result of an improper installation or a break in the ground wire).

In some examples, the distance(s) at which an unconnected ground may be detected may be based on the relative values of resistor 24, resistor 26, and resistor 28. For instance, if resistor 24 and resistor 26 each have an impedance of 1 MΩ, resistor 28 has an impedance of 10 kΩ, and the voltage across live AC connector 8 and neutral AC connector 10 AC signal has a frequency of 50 Hz and an RMS voltage of 230 volts, ground fault detector 6 may determine whether or not device 4 is grounded if ground connector 12 is connected to nothing, or if ground connector 12 is connected to a wire less than 200 meters that is not itself connected to ground (assuming that the wire has an average wire-earth capacity of 40 pF/m). However, if the values of resistor 24, resistor 26, and resistor 28 are decreased, the detection distance may also be increased because the decrease compensates for the capacitive coupling of the ground wire.

In some examples, ground fault detector 6 may be configured to continuously determine whether or not device 4 is grounded. In some examples, ground fault detector 6 may be configured to intermittently determine whether or not device 4 is grounded. For instance, by outputting a signal at enable 54, device 4 and/or ground fault detector 6 may cause ground fault detector 6 to determine whether or not device 4 is grounded. In this way, device 4 and/or ground fault detector 6 may reduce the amount of power consumed by device 4.

Figure 4:
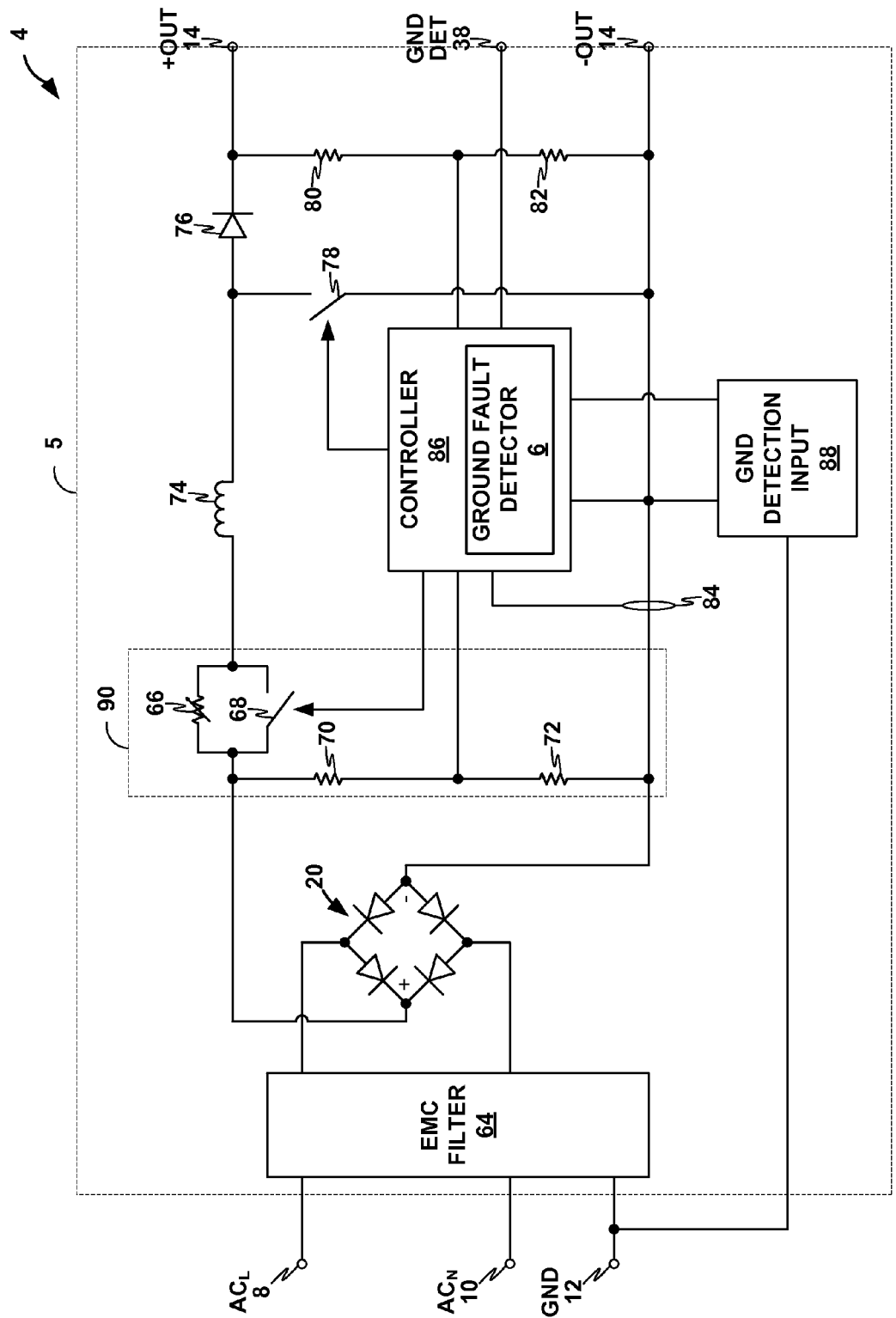
FIG. 4 is a circuit schematic illustrating an example device that includes a ground fault detector configured to determine whether or not the system is connected to ground, in accordance with one or more aspects of the present disclosure.

FIG. 4 is a circuit schematic illustrating an example device 4 including a ground fault detector configured to determine whether or not device 4 is connected to ground, in accordance with one or more aspects of the present disclosure. As discussed above, device 4 may be configured to receive electrical power from an AC source, such as AC source 14 of FIGS. 1A-1B, and use the received power to perform one or more functions. In the example of FIG. 4, device 4 may include power factor corrector (PFC) 5. As illustrated in FIG. 4, PFC 5 may include live AC connector 8, neutral AC connector 10, ground connector 12 (collectively, the "power connectors"), electromagnetic compatibility (EMC) filter 64, rectifier 20, in-rush current limiter 90, controller 86, and ground detection input 88. In some examples, PFC 5 may also include variable resistor 66, switch 68, resistor 70, resistor 72, inductor 74, diode 76, switch 78, resistor 80, resistor 82, and current sensor 84.

In some examples, PFC 5 may include ground detection input 88. Ground detection input 88 may include a conditioning network, such as conditioning network 21, the details of which are described above with reference to FIG. 2A. In some examples, PFC 5 may include controller 86. Controller 86 may be configured to perform a variety of functions to enable power factor correction.

In accordance with one or more techniques of this disclosure, controller 86 may include a ground fault detector, such as ground fault detector 6 of FIGS. 1-3, which may be configured to determine whether or not device 4 is connected to ground. In some examples, ground fault detector 6 may be configured to output a signal to ground detected output 38. As discussed above, in some examples, in response to receiving a signal at ground detected output 38 that indicates that device 4 is not grounded, device 4 may not perform one or more functions. For example, if PFC 5 is used to supply power to another device (which may be included in device 4), the other device may be configured to not perform one or more functions in response to receiving the signal at ground detected output 38 that indicates that device 4 is not connected to ground. As another example, the other device may be configured to not perform one or more functions unless a signal is received at ground detected output 38 that indicates that device 4 is connected to ground.

Figure 5A:
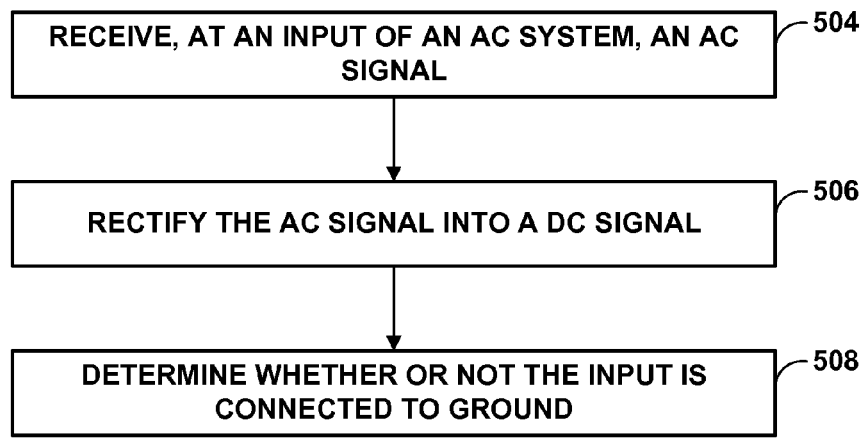
FIGS. 5A and 5B are flowcharts illustrating example operations of a circuit for determining whether or not a device is connected to ground, in accordance with one or more aspects of the present disclosure
Figure 5B:
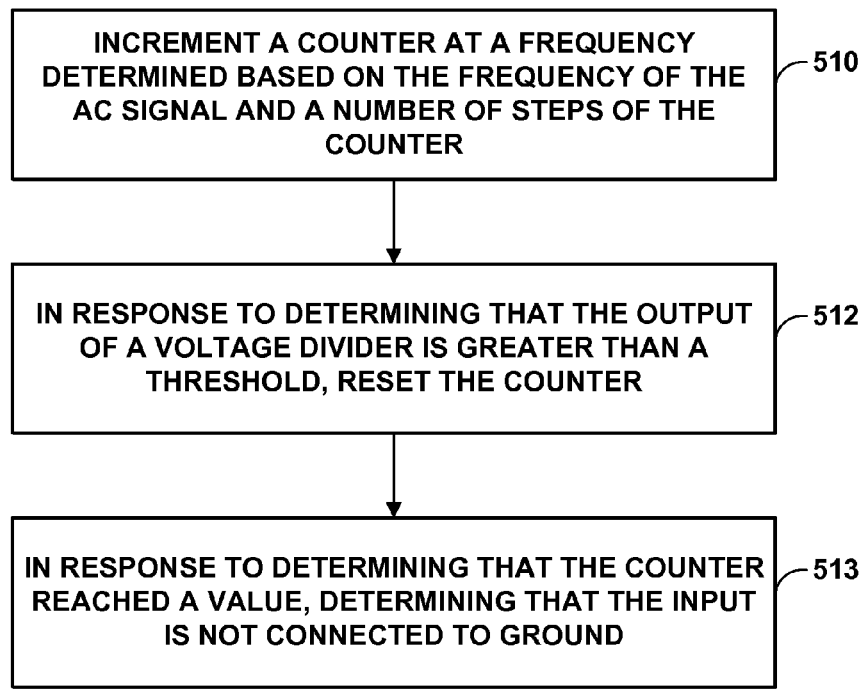

FIGS. 5A and 5B are flowcharts illustrating example operations of a circuit for determining whether or not a device is connected to ground, in accordance with one or more aspects of the present disclosure. For purposes of illustration, the techniques of FIGS. 5A and 5B are described within the context of device 4 and ground fault detector 6 of FIGS. 1-3 although devices and ground fault detectors having configurations different than that of device 4 and ground fault detector 6 may perform the techniques of FIGS. 5A and 5B.

In accordance with one or more techniques of this disclosure, device 4, may receive, at an input, an AC signal (504). For instance, device 4 may receive an AC signal across live AC connector 8 and neutral AC connector 10. Device 4 may rectify the AC signal into a DC signal (506). For instance, rectifier 20 of device 4 may rectify the AC signal into a DC signal. Device 4 may determine whether or not the input is connected to ground (508). For instance, ground fault detector 6 may determine whether or not device 4 is grounded. Ground fault detector 6 may increment a counter, such as counter 32, at a frequency determined based on the frequency of the AC signal and a number of steps of the counter (510). In response to determining that the output of a voltage divider, such as voltage divider 22, is greater than a threshold, ground fault detector 6 may reset the counter (512). In response to determining that the counter has reached a threshold value, ground fault detector 6 may determine that the device is not grounded (514).

FIGS. 6A-6D are graphs illustrating various signals of an example circuit for determining whether or not a device is connected to ground, in accordance with one or more techniques of this disclosure. As illustrated in FIG. 6A, graph 602 may include a horizontal axis representing time, plots 604A-604G illustrating a first set of digital signals, and plots 606A-606G illustrating a second set of digital signals. In some examples, the first set of digital signals may represent the outputs of counter 32 of device 4 of FIG. 2A and FIG. 3 where device 4 is connected to ground. In some examples, the second set of digital signals may represent the outputs of counter 33 of device 4 of FIG. 3 where device 4 is connected to ground.

As illustrated in FIG. 6B, graph 608 may include a horizontal axis representing time, a vertical axis representing voltage, and plot 610 representing a voltage signal. In some examples, the voltage signal may represent the voltage level at a buffer connected to node 44 and reset input 48 of counter 32 of device 4 of FIG. 2A and FIG. 3 where device 4 is connected to ground.

As illustrated in FIG. 6C, graph 612 may include a horizontal axis representing time, a vertical axis representing voltage, and plot 614 representing a voltage signal. In some examples, the voltage signal may represent the voltage level at node 44 of device 4 of FIG. 2A and FIG. 3 where device 4 is connected to ground.

As illustrated in FIG. 6D, graph 616 may include a horizontal axis representing time, a vertical axis representing voltage, and plot 618 representing a voltage signal. In some examples, the voltage signal may represent the voltage signal received across live AC connector 8 and neutral AC connector 10 of device 4 of FIG. 2A and FIG. 3 where device 4 is connected to ground.

In accordance with one or more techniques of this disclosure, a ground fault detector included in a device may determine that the device is not connected to ground if the output value of a first counter reaches a threshold value and/or if the output value of a second counter does not reach a threshold value. In some examples, a ground fault detector included in a device with signals corresponding to the signals of FIGS. 6A-6D may determine that the device is connected to ground because the digital signal illustrated by plot 604G does not become logic high prior to the signal illustrated by plot 610 becoming logic high (i.e., the output value of counter 32 does not reach 64). In some examples, a ground fault detector included in a device with signals corresponding to the signals of FIGS. 6A-6D may determine that the device is connected to ground because the digital signals illustrated by plots 606A, 606C, and 606D contemporaneously become logic high while signal illustrated by plot 610 is logic high (i.e., the output value of counter 33 does reach 13).

Figure 7A:
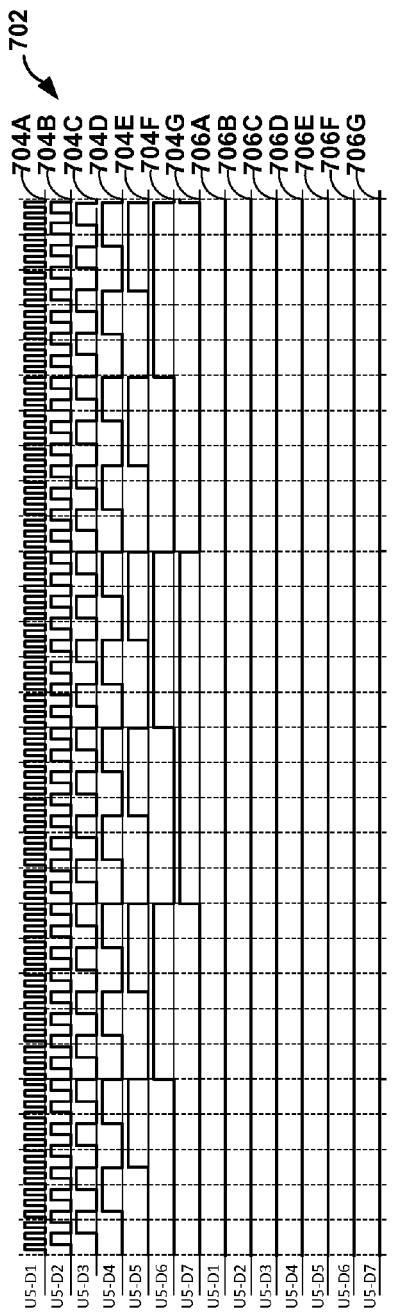
FIGS. 7A-7D are graphs illustrating various signals of an example circuit for determining whether or not a system is connected to ground, in accordance with one or more techniques of this disclosure.

FIGS. 7A-7D are graphs illustrating various signals of an example circuit for determining whether or not a device is connected to ground, in accordance with one or more techniques of this disclosure. As illustrated in FIG. 7A, graph 702 may include a horizontal axis representing time, plots 704A-704G illustrating a first set of digital signals, and plots 706A-706G illustrating a second set of digital signals. In some examples, the first set of digital signals may represent the outputs of counter 32 of device 4 of FIG. 2A and FIG. 3 where device 4 is not connected to ground within a first distance of device 4. In some examples, the second set of digital signals may represent the outputs of counter 33 of device 4 of FIG. 3 where device 4 is not connected to ground within a first distance of device 4.

Figure 7B:
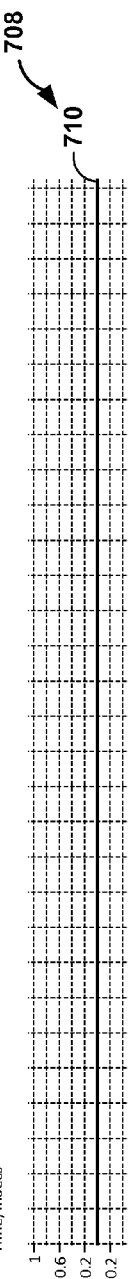

As illustrated in FIG. 7B, graph 708 may include a horizontal axis representing time, a vertical axis representing voltage, and plot 710 representing a voltage signal. In some examples, the voltage signal may represent the voltage level at a buffer connected to node 44 and reset input 48 of counter 32 of device 4 of FIG. 2A and FIG. 3 where device 4 is not connected to ground within a first distance of device 4.

Figure 7C:
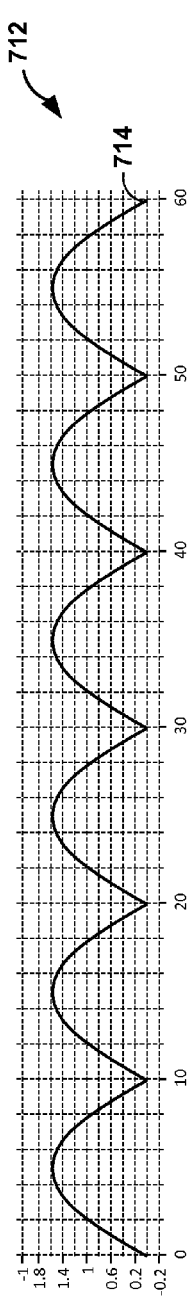

As illustrated in FIG. 7C, graph 712 may include a horizontal axis representing time, a vertical axis representing voltage, and plot 714 representing a voltage signal. In some examples, the voltage signal may represent the voltage level at node 44 of device 4 of FIG. 2A and FIG. 3 where device 4 is not connected to ground within a first distance of device 4.

Figure 7D:
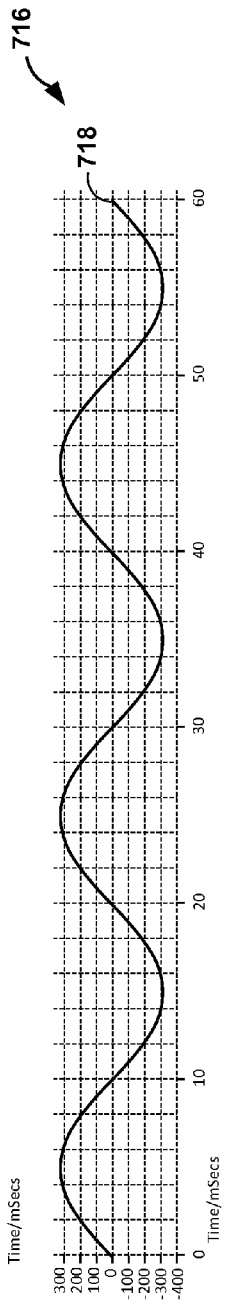

As illustrated in FIG. 7D, graph 716 may include a horizontal axis representing time, a vertical axis representing voltage, and plot 718 representing a voltage signal. In some examples, the voltage signal may represent the voltage signal received across live AC connector 8 and neutral AC connector 10 of device 4 of FIG. 2A and FIG. 3 where device 4 is not connected to ground within a first distance of device 4.

In accordance with one or more techniques of this disclosure, a ground fault detector included in a device may determine that the device is not connected to ground if the output value of a first counter reaches a threshold value and/or if the output value of a second counter does not reach a threshold value. In some examples, a ground fault detector included in a device with signals corresponding to the signals of FIGS. 7A-7D may determine that the device is not connected to ground because the digital signal illustrated by plot 704G does become logic high prior to the signal illustrated by plot 710 becoming logic high (i.e., the output value of counter 32 does reach 64).

Figure 8A:
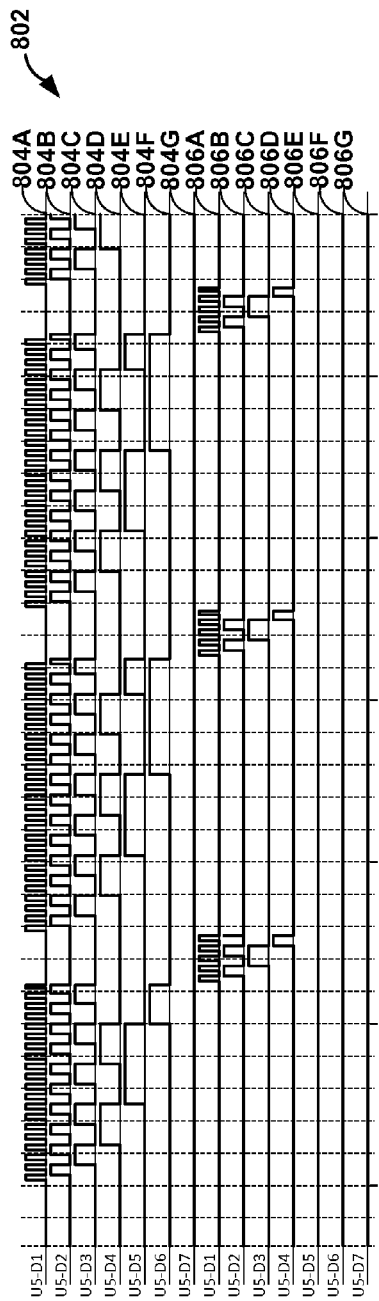
FIGS. 8A-8D are graphs illustrating various signals of an example circuit for determining whether or not a system is connected to ground, in accordance with one or more techniques of this disclosure.

FIGS. 8A-8D are graphs illustrating various signals of an example circuit for determining whether or not a device is connected to ground, in accordance with one or more techniques of this disclosure. As illustrated in FIG. 8A, graph 802 may include a horizontal axis representing time, plots 804A-804G illustrating a first set of digital signals, and plots 806A-806G illustrating a second set of digital signals. In some examples, the first set of digital signals may represent the outputs of counter 32 of device 4 of FIG. 2A and FIG. 3 where device 4 is not connected to ground within a second distance of device 4. In some examples, the second set of digital signals may represent the outputs of counter 33 of device 4 of FIG. 3 where device 4 is not connected to ground within a second distance of device 4.

Figure 8B:
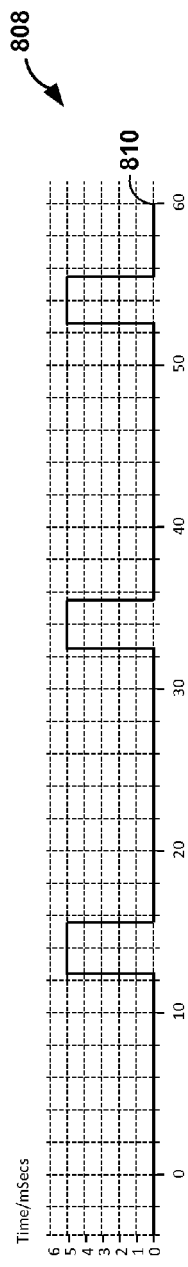

As illustrated in FIG. 8B, graph 808 may include a horizontal axis representing time, a vertical axis representing voltage, and plot 810 representing a voltage signal. In some examples, the voltage signal may represent the voltage level at a buffer connected to node 44 and reset input 48 of counter 32 of device 4 of FIG. 2A and FIG. 3 where device 4 is not connected to ground within a second distance of device 4.

Figure 8C:
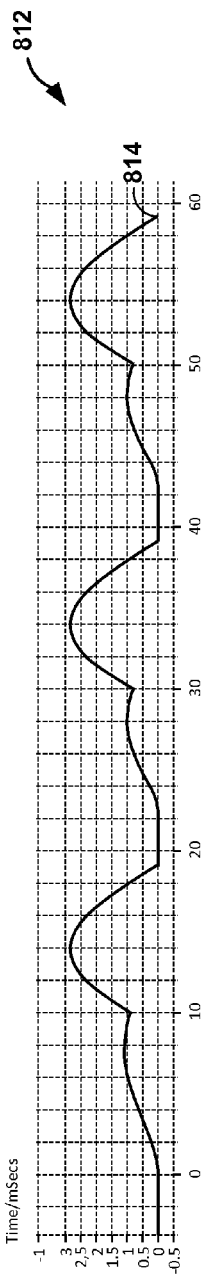

As illustrated in FIG. 8C, graph 812 may include a horizontal axis representing time, a vertical axis representing voltage, and plot 814 representing a voltage signal. In some examples, the voltage signal may represent the voltage level at node 44 of device 4 of FIG. 2A and FIG. 3 where device 4 is not connected to ground within a second distance of device 4.

Figure 8D:
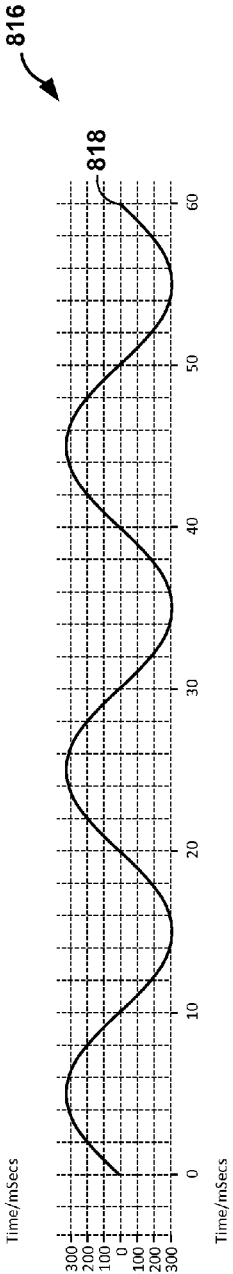

As illustrated in FIG. 8D, graph 816 may include a horizontal axis representing time, a vertical axis representing voltage, and plot 818 representing a voltage signal. In some examples, the voltage signal may represent the voltage signal received across live AC connector 8 and neutral AC connector 10 of device 4 of FIG. 2A and FIG. 3 where device 4 is not connected to ground within a second distance of device 4.

In accordance with one or more techniques of this disclosure, a ground fault detector included in a device may determine that the device is not connected to ground if the output value of a first counter reaches a threshold value and/or if the output value of a second counter does not reach a threshold value. In some examples, a ground fault detector included in a device with signals corresponding to the signals of FIGS. 8A-8D may determine that the device is connected to ground because the digital signals illustrated by plots 806A, 806C, and 806D do not contemporaneously become logic high while signal illustrated by plot 810 is logic high (i.e., the output value of counter 33 does not reach 13).

Example 1

A method comprising: receiving, at an input of a system, an AC signal; rectifying the AC signal into a DC signal; and determining, based on a value of one or more counters in a detection logic, whether or not the input is connected to ground.

Example 2

The method of example 1, wherein the determining whether or not the input is connected to ground comprises: incrementing a first counter of the one or more counters at a frequency determined based on the frequency of the AC signal and a number of steps of the first counter; in response to determining that the output of a conditioning network is greater than a threshold, resetting the first counter; and in response to determining that the first counter reached a value, determining that the input is not connected to ground.

Example 3

The method of any combination of examples 1-2, wherein the conditioning network includes a voltage divider configured to have a ratio selected such that, during the time period corresponding to the negative half-wave of the AC signal, the output of the voltage divider exceeds the threshold if the input is connected to ground.

Example 4

The method of any combination of examples 1-3, wherein the value is a first value, and wherein determining whether or not the input is connected to ground further comprises: in response to determining that the output of the voltage divider is greater than the threshold, incrementing a second counter of the one or more counters; in response to determining that the output of a voltage divider is less than the threshold, resetting the second counter; and in response to determining that, prior to being reset, the second counter did not reach the second value, determining that the input is not connected to ground.

Example 5

The method of any combination of examples 1-4, wherein determining whether or not the input is connected to ground comprises determining whether or not the input is connected to ground within a distance of the system, wherein the input is not connected to ground within a first portion of the distance if the first counter reaches the first value, wherein the input is not connected to ground within a second portion of the distance if the second counter does not reaches the second value.

Example 6

The method of any combination of examples 1-5, wherein the frequency at which the first counter is incremented is determined approximately in accordance with the following equation:

$$f_{counter} = f_{AC} * \frac{2^n}{2},$$

wherein $f_{counter}$ is the frequency at which the first counter is incremented, $f_{AC}$ is the frequency of the AC signal, and n is a number of bits of the first counter.

Example 7

The method of any combination of examples 1-6, wherein determining whether or not the input is connected to ground comprises determining whether or not the input is connected to ground in response to receiving an enable signal.

Example 8

The method of any combination of examples 1-7, wherein determining whether or not the input is connected to ground comprises determining whether or not the input is connected to ground within a distance of the system, and wherein the distance is based on the values of the components of the conditioning network.

Example 9

The method of any combination of examples 1-8, wherein the system comprises electric vehicle supply equipment (EVSE), the method further comprising: in response to determining that the input is not connected to ground, preventing the EVSE from supplying power to an electric vehicle.

Example 10

A system comprising: an input configured to receive an AC signal; a rectifier configured to rectify the received AC signal into a DC signal; and a ground fault detector configured to determine, based on a value of one or more counters included in the ground fault detector, whether or not the input is connected to ground.

Example 11

The system of example 10, wherein a first counter of the one or more counters is configured to increment at a frequency determined based on the frequency of the AC signal and the number of steps of the first counter, the system further comprising: a conditioning network, wherein the counter is configured to reset in response to the voltage level at the output of the conditioning network exceeding a threshold; and an output configured to indicate whether or not the input is connected to ground, wherein the output is configured to indicate that the input is not connected to ground in response to the counter reaching a value.

Example 12

The system of any combination of examples 10-11, wherein the conditioning network includes a voltage divider, and wherein the voltage divider comprises: a first resistor connected to a positive output of the rectifier and a ground connector of the input; a second resistor connected to the ground connector of the input and a node, wherein the node is the output of the voltage divider; and a third resistor connected to a negative output of the rectifier and the node, wherein the values of the resistors are selected such that, during the time period corresponding to the negative half-wave of the AC signal, the output of the voltage divider exceeds the threshold if the input is connected to ground.

Example 13

The system of any combination of examples 10-12, wherein the value is a first value, wherein a second counter of the one or more counters is configured to increment, wherein the second counter is configured to reset in response to the voltage level at the output of the conditioning network falls below the threshold, and wherein the output is configured to indicate that the input is not connected to ground in response to the second counter not reaching a second value.

Example 14

The system of any combination of examples 10-13, wherein the ground fault detector is configured to determine whether or not the input is connected to ground within a distance of the ground fault detector, wherein the first counter is configured to determine whether or not the input is connected to ground within a first portion of the distance, wherein the second counter is configured to determine whether or not the input is connected to ground within a second portion of the distance.

Example 15

The system of any combination of examples 10-14, wherein the frequency at which the first counter is incremented is determined approximately in accordance with the following equation:

$$f_{counter} = f_{AC} * \frac{2^n}{2},$$

wherein $f_{counter}$ is the frequency at which the first counter is incremented, $f_{AC}$ is the frequency of the AC signal, and n is a number of bits of the first counter.

Example 16

The system of any combination of examples 10-15, further comprising: an enable input configured to enable the ground fault detector in response to receiving an enable signal.

Example 17

The system of any combination of examples 10-16, wherein the ground fault detector is configured to determine whether or not the input is connected to ground within a distance of the system, and wherein the distance is based on the values of the components of the conditioning network.

Example 18

The system of any combination of examples 10-17, wherein the system comprises electric vehicle supply equipment (EVSE), wherein in response to the value of a counter of the one or more counters indicating that the input is not connected to ground, the EVSE is prevented from supplying power to an electric vehicle.

Example 19

A system comprising: means for receiving, at an input of a system, an AC signal; means for converting the AC signal into a DC signal; and means for determining whether or not the input is connected to ground, wherein the means for determining comprise means for counting.

Example 20

The system of example 19, wherein the means for determining further comprise: means for resetting the means for counting in response to determining that the output of a conditioning network is greater than a threshold, wherein the means for determining whether or not the input is connected to ground are configured to determine that the input is not connected to ground if the means for counting reach a value.

Example 21

The system of example 20, wherein the means for counting are first means for counting, wherein the value is a first value, wherein the means for determining whether or not the input is connected to ground further comprise: second means for counting; means for resetting the second means for counting in response to determining that the output of the conditioning network is less than the threshold, wherein the means for determining whether or not the input is connected to ground are configured to determine that the input is not connected to ground if the second means for counting do not reach a second value.

Example 22

The system of any combination of examples 20-21, wherein the means for counting are configured to count at a frequency determined based on the frequency of the AC signal and a number of steps of the means for counting.

Example 23

The system of any combination of examples 20-22, wherein the means for determining whether or not the input is connected to ground are configured to determine whether or not the input is connected to ground in response to receiving an enable signal.

Example 24

The system of any combination of examples 20-23, further comprising means for performing any combination of the techniques of examples 1-9.

Various examples of the invention have been described. These and other examples are within the scope of the following claims.

The invention claimed is:
1. A method comprising:
receiving, at an input of a system, an AC signal;
rectifying the AC signal into a DC signal;
incrementing a first counter of one or more counters at a frequency determined based on the frequency of the AC signal and a number of steps of the first counter;
in response to determining that the output of a conditioning network is greater than a threshold, resetting the first counter; and
in response to determining that the first counter reached a value, determining that the input is not connected to ground.

2. The method of claim 1, wherein the conditioning network includes a voltage divider configured to have a ratio selected such that, during the time period corresponding to the negative half-wave of the AC signal, the output of the voltage divider exceeds the threshold if the input is connected to ground.

3. The method of claim 1, wherein the value is a first value, the method further comprising:
in response to determining that the output of the voltage divider is greater than the threshold, incrementing a second counter of the one or more counters;
in response to determining that the output of a voltage divider is less than the threshold, resetting the second counter; and
in response to determining that, prior to being reset, the second counter did not reach the second value, determining that the input is not connected to ground.

4. The method of claim 3, wherein determining whether or not the input is connected to ground comprises determining whether or not the input is connected to ground within a distance of the system, wherein the input is not connected to ground within a first portion of the distance if the first counter reaches the first value, wherein the input is not connected to ground within a second portion of the distance if the second counter does not reaches the second value.

5. The method of claim 1, wherein the frequency at which the first counter is incremented is determined approximately in accordance with the following equation:

$$f_{counter} = f_{AC} * \frac{2^n}{2},$$

wherein $f_{counter}$ is the frequency at which the first counter is incremented, $f_{AC}$ is the frequency of the AC signal, and n is a number of bits of the first counter.

6. The method of claim 1, further comprising:
determining whether or not the input is connected to ground in response to receiving an enable signal.

7. The method of claim 1, further comprising:
determining whether or not the input is connected to ground within a distance of the system, and wherein the distance is based on the values of the components of the conditioning network.

8. The method of claim 1, wherein the system comprises electric vehicle supply equipment (EVSE), the method further comprising:
in response to determining that the input is not connected to ground, preventing the EVSE from supplying power to an electric vehicle.

9. A system comprising:
an input configured to receive an AC signal;
a rectifier configured to rectify the received AC signal into a DC signal;
a conditioning network; and
a ground fault detector configured to determine, in response to determining that a first counter of one or more counters included in the ground fault detector reached a value, that the input is not connected to ground, wherein the first counter is configured to:
increment at a frequency determined based on the frequency of the AC signal and a number of steps of the first counter, and reset in response to the voltage level at the output of the conditioning network exceeding a threshold.

10. The system of claim 9, further comprising:
an output configured to indicate whether or not the input is connected to ground.

11. The system of claim 9, wherein the conditioning network includes a voltage divider, and wherein the voltage divider comprises:
a first resistor connected to a positive output of the rectifier and a ground connector of the input;
a second resistor connected to the ground connector of the input and a node, wherein the node is the output of the voltage divider; and
a third resistor connected to a negative output of the rectifier and the node,
wherein the values of the resistors are selected such that, during the time period corresponding to the negative half-wave of the AC signal, the output of the voltage divider exceeds the threshold if the input is connected to ground.

12. The system of claim 9, wherein the value is a first value, wherein a second counter of the one or more counters is configured to increment, wherein the second counter is configured to reset in response to the voltage level at the output of the conditioning network falls below the threshold, and wherein the ground fault detector is configured to determine that the input is not connected to ground in response to the second counter not reaching a second value.

13. The system of claim 12, wherein the ground fault detector is configured to determine whether or not the input is connected to ground within a distance of the ground fault detector, wherein the first counter is configured to determine whether or not the input is connected to ground within a first portion of the distance, wherein the second counter is configured to determine whether or not the input is connected to ground within a second portion of the distance.

14. The system of claim 9, wherein the frequency at which the first counter is incremented is determined approximately in accordance with the following equation:

$$f_{counter} = f_{AC} * \frac{2^n}{2},$$

wherein $f_{counter}$ is the frequency at which the first counter is incremented, $f_{AC}$ is the frequency of the AC signal, and n is a number of bits of the first counter.

15. The system of claim 9, further comprising:
an enable input configured to enable the ground fault detector in response to receiving an enable signal.

16. The system of claim 9, wherein the ground fault detector is configured to determine whether or not the input is connected to ground within a distance of the system, and wherein the distance is based on the values of the components of the conditioning network.

17. The system of claim 9, wherein the system comprises electric vehicle supply equipment (EVSE), wherein in response to the value of a counter of the one or more counters indicating that the input is not connected to ground, the EVSE is prevented from supplying power to an electric vehicle.

18. A system comprising:
means for receiving, at an input of a system, an AC signal;
means for converting the AC signal into a DC signal;
means for incrementing a first counter of one or more counters at a frequency determined based on the frequency of the AC signal and a number of steps of the first counter;
means for resetting the first counter in response to determining that the output of a conditioning network is greater than a threshold; and
means for determining that the input is not connected to ground in response to determining that the first counter reached a value.

19. The system of claim 18, wherein the means for determining whether or not the input is connected to ground are configured to determine whether or not the input is connected to ground in response to receiving an enable signal.

20. The system of claim 18, wherein the value is a first value, the system further comprising:
means for incrementing a second counter of the one or more counters in response to determining that the output of the voltage divider is greater than the threshold;
means for resetting the second counter in response to determining that the output of a voltage divider is less than the threshold; and
means for determining that the input is not connected to ground in response to determining that, prior to being reset, the second counter did not reach the second value.

21. The system of claim 18, wherein the frequency at which the means for incrementing increment the first counter is determined approximately in accordance with the following equation:

$$f_{counter} = f_{AC} * \frac{2^n}{2},$$

wherein $f_{counter}$ is the frequency at which the first counter is incremented, $f_{AC}$ is the frequency of the AC signal, and n is a number of bits of the first counter.

* * * * *